United States Patent
Kuribayashi et al.

(10) Patent No.: US 6,877,220 B1
(45) Date of Patent: Apr. 12, 2005

(54) METHOD FOR FEEDING A COMPONENT

(75) Inventors: Takeshi Kuribayashi, Yamanashi (JP); Hiroshi Uchiyama, Kofu (JP); Akihiko Wachi, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/743,349

(22) PCT Filed: Sep. 14, 1999

(86) PCT No.: PCT/JP99/05005
§ 371 (c)(1),
(2), (4) Date: Jan. 9, 2001

(87) PCT Pub. No.: WO00/18208
PCT Pub. Date: Mar. 30, 2000

(30) Foreign Application Priority Data

Sep. 17, 1998 (JP) .......................... 10-262947

(51) Int. Cl.[7] .............................................. H05K 3/30
(52) U.S. Cl. .............................. 29/832; 29/830; 29/833; 29/834; 29/836; 29/837; 29/742; 414/225.01; 414/222.02; 414/222.03; 414/226.01
(58) Field of Search ........................ 29/830, 832, 833, 29/834, 837, 759, 760, 742, 836; 414/225.01, 222.02, 222.03, 226.01

(56) References Cited

U.S. PATENT DOCUMENTS

| | | | | |
|---|---|---|---|---|
| 4,610,083 A | * | 9/1986 | Campisi et al. | 29/832 |
| 4,813,752 A | * | 3/1989 | Schindler | 312/368 |
| 4,872,257 A | * | 10/1989 | Wakamori et al. | 29/701 |
| 5,228,193 A | * | 7/1993 | Yanagawa et al. | |
| 5,235,164 A | * | 8/1993 | Noyama et al. | 235/375 |
| 5,283,943 A | * | 2/1994 | Aguayo et al. | 29/701 |
| 5,329,690 A | * | 7/1994 | Tsuji et al. | 29/701 |
| 5,402,564 A | * | 4/1995 | Tsukasaki et al. | 29/832 |
| 5,727,311 A | * | 3/1998 | Ida et al. | 29/832 |
| 5,839,187 A | * | 11/1998 | Sato et al. | 29/743 |
| 5,911,456 A | * | 6/1999 | Tsubouchi et al. | 29/833 |
| 6,058,599 A | * | 5/2000 | Hanamura | 29/739 |
| 6,085,408 A | * | 7/2000 | Watanabe | 29/720 |
| 6,427,320 B1 | * | 8/2002 | Seto et al. | 29/739 |
| 6,446,333 B1 | * | 9/2002 | Kashiwagi et al. | 29/833 |
| 2002/0092157 A1 | * | 7/2002 | Yoshida et al. | 29/740 |
| 2002/0112346 A1 | * | 8/2002 | Hata et al. | 29/834 |

FOREIGN PATENT DOCUMENTS

| | | |
|---|---|---|
| JP | 60-206098 | 10/1985 |
| JP | 4-164398 | 6/1992 |
| WO | 98/32318 | 7/1998 |

* cited by examiner

Primary Examiner—Carl J. Arbes
Assistant Examiner—Tai Nguyen
(74) Attorney, Agent, or Firm—Wenderoth, Lind & Ponack, L.L.P.

(57) ABSTRACT

An occurrence component lack at a component arrangement position, designated by a mounting program, of a component feed part, which feeds components to be mounted, is determined. Whether a spare component for the lacking component to be mounted is present in a spare component feed area of the component feed part is determined, and supply of the component to be mounted from a designated component arrangement position of the component feed part is switched to supply of the spare component from the spare component feed area.

5 Claims, 11 Drawing Sheets

Fig.5A
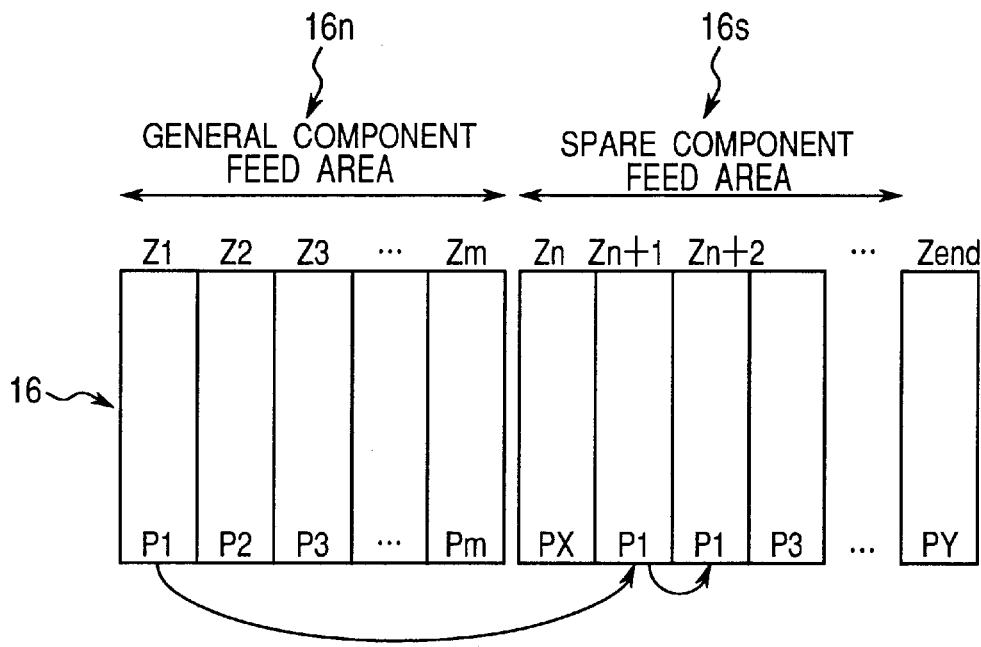
Fig.5B
A TYPE
Z1=P1
Z2=P2
Z3=P3
Z4=P4
⋮  ⋮
Zm=Pm
⇩
B TYPE
Z1=P3
Z2=PX
Z3=P1
Z4=PY
⋮  ⋮
Zm=Pm
Fig.5C
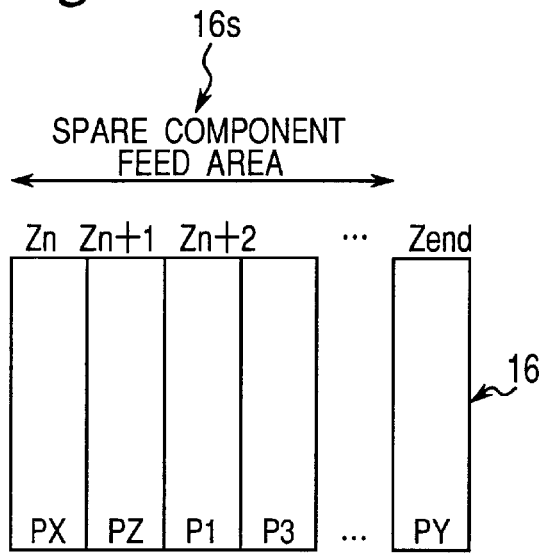

METHOD FOR FEEDING A COMPONENT

TECHNICAL FIELD

The present invention relates to a method and an apparatus for feeding components which are supplied to a component holding member, such as a mounting head or the like, which removes the components from a component feed part and in turn mounts the removed components to a mounting position on a printed board. The present invention also relates to a method for mounting components supplied by the component feed method to the board, and an apparatus for mounting the components supplied by the component feeding apparatus to the board.

BACKGROUND ART

Productivity improvement has been required in component mounting apparatuses these days. Particularly, production interruption subsequent to switching of product types (kinds) and lack of components adversely influences productivity, and therefore improvement in this field is strongly demanded.

Prior art known for enhancing operation of a component feed part of a component mounting apparatus is disclosed, e.g., in Japanese Unexamined Patent Publication No. 60-206098.

This prior art apparatus will be described below with reference to FIGS. 10 and 11.

A constitution of an entire component mounting apparatus will be schematically depicted first. FIG. 10 shows a component mounting apparatus of a high-speed type, and FIG. 11 shows a component mounting apparatus of a multi-functional middle-speed type.

In FIG. 10, a component mounting apparatus 10 of a high-speed type comprises an operation part 11, a control part 12, mounting heads 13, a mounting table 14, a transfer rail 15, and a component feed part 16. The component feed part 16 loads a plurality of parts cassettes 16a which slide to feed predetermined components to the mounting heads 13. The mounting table 14 holds printed boards 1, and positions the boards sequentially to mount the predetermined components.

In FIG. 11, a component mounting apparatus 110 of a multi-functional middle-speed type comprises an operation part 111, a control part 112, a mounting head 113, a board recognition device 113a, a component inspection part 113b, a mounting table 114, a transfer rail 115, and a component feed part 116. The component feed part 116 is equipped with a parts cassette 116a, a bulk cassette 116b, a parts tray container part 116c, and parts trays 116d, so that many kinds of components 5 can be supplied from the component feed part 116. The mounting head 113 removes an electronic component 5 from the component feed part 116, moves the component to a predetermined component mounting position of the mounting table 114, and then mounts the component onto a printed board 1.

The following description will be directed to how a component feed part is conventionally switched to cope with a lack of components in a component mounting apparatus.

FIG. 8A is an explanatory diagram of an example of a conventional exchange mode, FIG. 8B is an explanatory diagram of an example of a conventional preparation mode, and FIGS. 9A and 9B are schematic diagrams of examples of a conventional switch mode in an alternate operation and a mounting program, respectively.

According to the conventional exchange mode shown in FIG. 8A, component feed part 16, 116 is divided into two groups A and B, and the same parts are arranged at the same positions in groups A and B, respectively, so that, for instance, group A if lacking in components is switched for group B.

In the conventional preparation mode shown in FIG. 8B, the component feed part 16, 116 is divided into two groups A and B and, components to be mounted to A-type boards and B-type boards are arranged in groups A and B, respectively, thereby coping with switching of types of boards to be produced.

As is disclosed in publication No. 60-206098 referred to earlier, according to the conventional alternate operation shown in FIGS. 9A and 9B, spare components are removed from cassettes of a preliminarily designated spare component feed part when a component feed part lacks components (in other words, the component feed part is switched for the spare component feed part), so that production is continued. More specifically, when a parts cassette P1 by way of example is depleted of components in the component feed part 16, 116, the component feed part is switched to a feed position Z1=Zn, Zn=Zn+1 designated by spare component information 20c, thereby automatically switching to spare components to continue production.

In the above-described prior art constitution, it is necessary to construct the component feed part for spare components into units for each kind of board to be produced, or set spare components at the component feed part in the same arrangement for each kind of board to be produced; that is, it is necessary to assign component information (referred to as spare component information hereinafter) indicating respective set positions of spare components at the component feed part within a mounting program (relating to NC program or component arrangement or the like) designed for mounting components to printed boards of optional kinds.

Components should be set at a designated component feed position at the component feed part. A mounting program indicating the spare component information should be formed for each kind of board in the case of production of a wide variety of bands with a relatively low volume. Moreover, the mounting program should be replaced, or a similar preparation process is needed for switching kinds of boards to be produced. In other words, switching is complicated and takes time, thereby increasing an operator's burden for preparation, management, and the like of the switching.

If spare components are set at a wrong position at a time of switching production, and when the component feed part is depleted of components, components designated as spare components at a component feed position, although this position is wrong, are automatically continuously mounted during an exchange mode or alternate operation, resulting in a quality issue.

During execution of the exchange mode or alternate operation, operation is wasted if components are mounted in a mounting order before being changed, thereby greatly worsening production time per one board, i.e., mounting cycle time, and thus productivity is deteriorated.

SUMMARY OF THE INVENTION

The present invention is devised to solve the above-described issues, and has for its object to provide a method and an apparatus for feeding components and a method and an apparatus for mounting components, which realize production of higher flexibility, high productivity, and high quality during an exchange mode or alternate operation of automatically switching components with spare components even though component lack has occurred, and enables continuous mounting of components to boards.

In accomplishing these and other objects, according to a first aspect of the present invention, there is provided a component feed method wherein a component is supplied from a component arrangement position at a component feed part designated by a mounting program when the component is to be mounted at a mounting position on a printed board based on the mounting program.

The method includes:

a component lack detection process of detecting a lack of a component to be mounted, which is designated by the mounting program, at a component arrangement position of the component feed part;

a spare component detection judgment process of determining whether or not a spare component for a lacking component to be mounted is loaded in a spare component feed area of the component feed part, and judging whether or not the spare component is located within the spare component feed area; and a spare component switch process of switching supply of the component to be mounted from a designated component arrangement position of the component feed part to supply of the spare component from the spare component feed area, when the spare component is judged to be present in the spare component feed area during the spare component detection judgment process.

According a second aspect of the present invention, there is provided a component feed method according to the first aspect, wherein the spare component feed area of the component feed part during the spare component detection judgment process is an area other than a component feed area at which component supply is designated in the mounting program designed for mounting a component to a printed board of an optional type. Accordingly, supply of the component, to be mounted, from the component feed area of the component feed part is switched during the spare component switch process to supply of the spare component from the spare component feed area when the spare component is judged to be present in the spare component feed area during the spare component detection judgment process.

According to a third aspect of the present invention, there is provided a component feed method according to the first aspect, wherein the spare component feed area of the component feed part during the spare component detection judgment process is an area overlapping a component feed area at which component supply is designated in a mounting program designed for mounting a component to a printed board of an optional type. Accordingly, supply of the component, to be mounted, from the component feed area of the component feed part is switched during the spare component switch process to supply of the spare component from the spare component feed area when the spare component is judged to be present in the spare component feed area during the spare component detection judgment process.

According to a fourth aspect of the present invention, there is provided a component feed method according to any one of the first to third aspects, wherein whether or not the spare component, for the lacking component to be mounted, is loaded in the spare component feed area of the component feed part is determined, during the spare component detection judgment process, from component data which stores beforehand information on types or characteristics and arrangement positions of components arranged in the spare component feed area of the component feed part, thereby judging whether or not the spare component is present in the spare component feed area.

According to a fifth aspect of the present invention, there is provided a component feed method according to any one of the first to third aspects, which includes, prior to the spare component detection judgment process, a spare component designation process of preliminarily designating and registering a component arrangement position of a spare component of the component feed part which can replace a component to be mounted if the component feed part lacks this component. Also, during the spare component detection judgment process a spare component corresponding to a lacking component to be mounted is detected from spare components of the component feed part designated and registered during the spare component designation process, thereby judging presence/absence of a spare component corresponding to a lacking component to be mounted.

According to a sixth aspect of the present invention, there is provided a component mounting method, which includes a component mounting order reorganization process such that after a spare component is automatically switched during the spare component switch process subsequent to component lack during the component feed method according to any one of the first to fifth aspects, a mounting order is operated in conformity with a component feed state switched for the spare component, thereby regenerating a mounting program.

According to a seventh aspect of the present invention, there is provided a component mounting apparatus which removes a component from a component arrangement position designated by a mounting program of a component feed part on the basis of the mounting program, and mounts the component at a mounting position on a printed board.

The apparatus comprises:

a component lack detection device for detecting lack of a component to be mounted at the component arrangement position of the component feed part designated by the mounting program, a spare component detection judgment device for determining whether or not a spare component for a lacking component to be mounted is loaded in a spare component feed area of the component feed part, and judging whether or not the spare component is located within the spare component feed area, and a spare component switch device for switching supply of the component to be mounted from the designated component arrangement position of the component feed part to supply of the spare component from the spare component feed area when the spare component is judged to be present within the spare component feed area by the spare component detection judgment device.

According to an eighth aspect of the present invention, there is provided a component feeding apparatus according to the seventh aspect, wherein the spare component feed area of the component feed part judged by the spare component detection judgment device is an area other than a component feed area at which component supply is designated in the mounting program designed for mounting the component to a printed board of an optional type, so that supply of the component to be mounted from the component feed area of the component feed part is switched by the spare component switch device to supply of the spare component from the spare component feed area when the spare component is judged to be present in the spare component feed area by the spare component detection judgment device.

According to a ninth aspect of the present invention, there is provided a component feeding apparatus according the seventh aspect, wherein a spare component feed area of the component feed part judged by the spare component detection judgment device is an area overlapping with a component feed area at which component supply is designated in the mounting program designed for mounting a component to the printed board of an optional type, so that supply of the component to be mounted from the component feed area of the component feed part is switched by the spare component switch device to supply of the spare component from the spare component feed area when the spare component is judged to be present in the spare component feed area by the spare component detection judgment device.

According to a tenth aspect of the present invention, there is provided a component feeding apparatus according to any one of the seventh to ninth aspects, wherein whether or not a spare component for a lacking component to be mounted is loaded in the spare component feed area of the component feed part is determined by the spare component detection judgment device from component data which stores beforehand information on types or characteristics and arrangement positions of components arranged in the spare component feed area of the component feed part, thereby judging whether or not the spare component is present in the spare component feed area.

According to an eleventh aspect of the present invention, there is provided a component feeding apparatus according to any one of the seventh to ninth aspects, which comprises a spare component designation device for preliminarily designating and registering, prior to spare component detection judgment, a component arrangement position of a spare component at the component feed part which can replace a component to be mounted if the component feed part lacks the component, while the spare component detection judgment device detects a spare component corresponding to the lacking component, to be mounted, from spare components of the component feed part designated and registered by the spare component designation device, thereby judging presence/absence of the spare component corresponding to the lacking component to be mounted.

According to a twelfth aspect of the present invention, there is provided a component mounting apparatus, which includes a component mounting order reorganization device for, after a spare component is automatically switched by the spare component switch device subsequent to component lack in the component feeding apparatus according to any one of the seventh to eleventh aspects, operating a mounting order in conformity with a component feed state switched for the spare component, and thereby re-generating a mounting program.

BRIEF DESCRIPTION OF DRAWINGS

These and other aspects and features of the present invention will become clear from the following description taken in conjunction with the preferred embodiments thereof with reference to the accompanying drawings, in which:

FIG. 5A is a schematic explanatory diagram of how spare components are switched at a component feed part in the component mounting apparatus according to the first embodiment of the present invention, that is, in detail, a schematic diagram of an arrangement example at the component feed part with a component feed area and a spare component feed area;

FIG. 5B is a schematic diagram of a mounting program for two types, i.e., A and B types of boards;

FIG. 5C is a schematic diagram of an arrangement example of the spare component feed area of the component feed part;

DETAILED DESCRIPTION OF THE PREFERRED EMBODIMENTS

Figure 1:
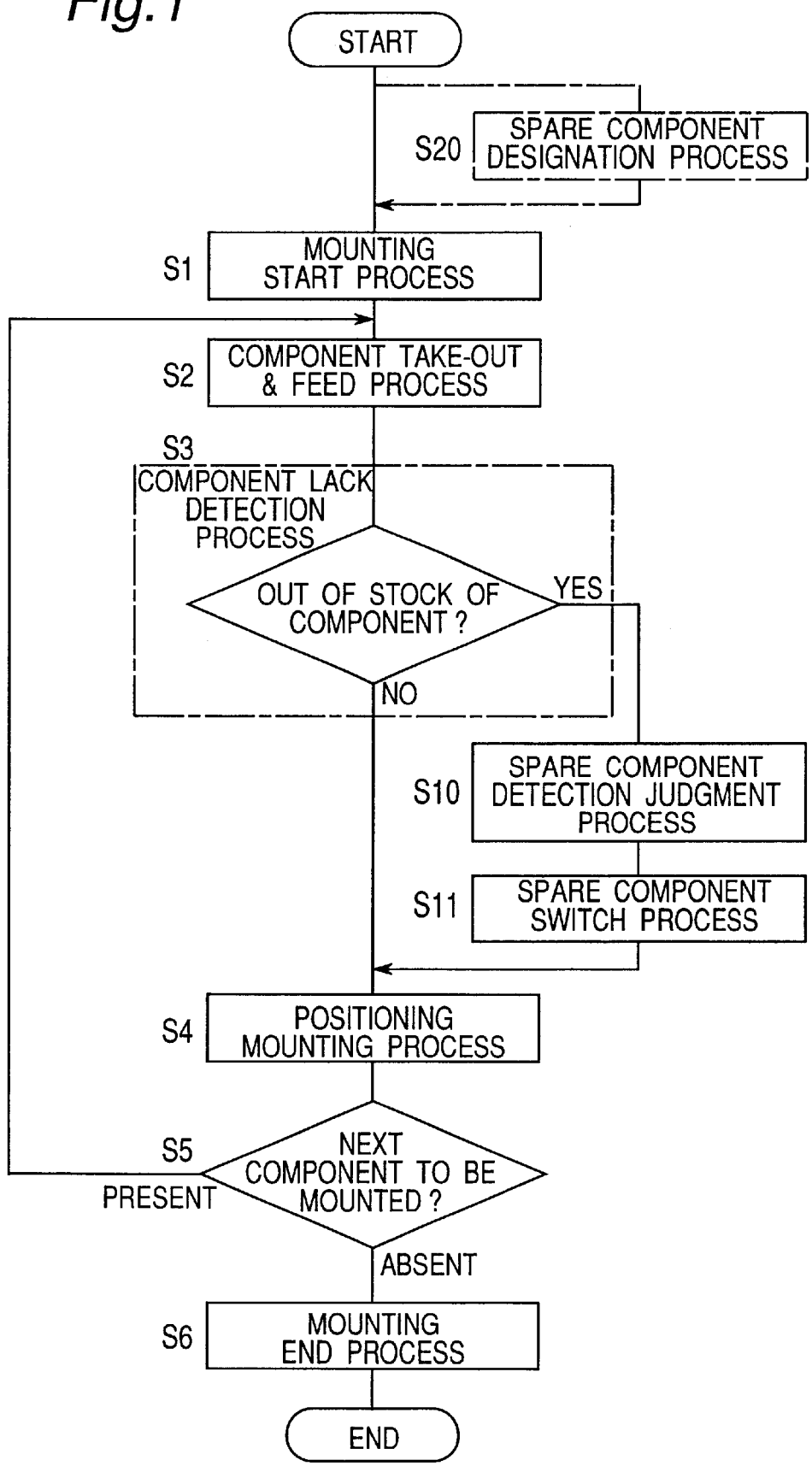
FIG. 1 is a flow chart of a component mounting method including a component feed method (free alternate operation) according to a first embodiment of the present invention.

Before description of the present invention proceeds, it is to be noted that like parts are designated by like reference numerals throughout the accompanying drawings.

First Embodiment

A component feed method, a component feeding apparatus, a component mounting method, and a component mounting apparatus according to a first embodiment of the present invention will be discussed with reference to the drawings.

The first embodiment will be described on the basis of component mounting apparatus 201 which is equipped with a component feeding apparatus so as to execute a component mounting method including a component feed method. The component mounting apparatus 201 is schematically formed as a component mounting apparatus of a high-speed type shown in FIG. 10 of the prior art except for control part 12, and therefore will be described with reference to FIG. 10. Parts of the same function as in the prior art are denoted by the same reference numerals.

Figure 2:
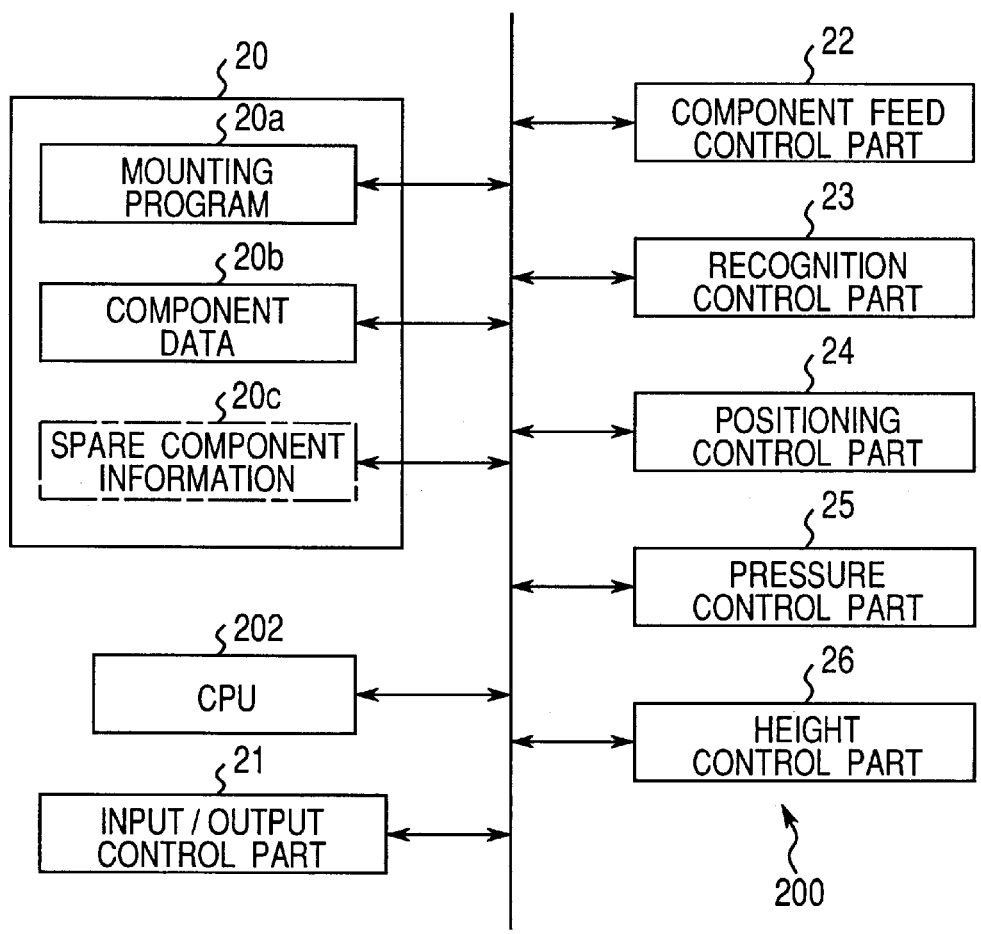
FIG. 2 is a block diagram schematically showing a mounting control part of a component mounting apparatus according to the first embodiment of the present invention.

FIG. 1 is a flow chart showing the component mounting method including the component feed method according to the first embodiment of the present invention. FIG. 2 is a block diagram schematically showing a mounting control part 200 of the component mounting apparatus 201 which replaces the control part 12. In FIG. 2, reference numeral 20 is a memory part, and reference numeral 20a is a mounting program stored in the memory part 20. Reference numeral 20b is component data stored in the memory part 20 and showing component arrangement data consisting of component arrangement positions at a component feed part 16. Reference numeral 20c is spare component information having spare component data such as types of spare components, or properties of spare components, or types and properties and arrangement positions of spare components written in the memory part 20. Reference numeral 21 is an input/output control part for controlling inputs and outputs of information and signals from external devices or members to the memory part 20 and control parts 22–26 described below. Reference numeral 22 is a component feed control part functioning as an example of a spare component detection device, for controlling supply of components 5 from parts cassettes 16a of component feed part 16, and for detecting an occurrence of component lack. Reference numeral 23 is a recognition control part for controlling recognition of positions and attitudes of components 5 sucked and held to a plurality of mounting heads 13 supported by a rotary head, which rotates to pass a component feed position at which the components are supplied from the parts cassettes 16a of the component feed part 16, and a component mounting position at which the components are mounted to boards 1. Reference numeral 24 is a positioning control part for controlling positioning of the components 5, sucked and held to the mounting heads 13, relative to the boards 1 while correcting positions and attitudes of the components 5 based on a recognition result from the recognition control part 23. Reference numeral 25 is a pressure control part for controlling a press force of the mounting heads 13 to thereby mount the components 5 to the boards 1 while the components are sucked and held by the mounting heads 13. Reference numeral 26 is a height control part for controlling a height of a movement area of the mounting heads 13 relative to the boards 1, while taking detected heights of components already mounted to the boards 1 into consideration, when heights of the components 5 sucked and held by the mounting heads 13 are detected. Subsequently, the components are mounted to the boards 1. Reference numeral 202 is a CPU for controlling operations of each driving, part of the component mounting apparatus 201, for controlling information read and write operations to and from the memory part 20, and for controlling operations of the control parts 21–26. Also as indicated in FIG. 3, the mounting control part 200 is connected to rotary head 301, mounting heads 13, component feed part 16, board recognition device 13a, component inspection part 13b, mounting table 14, and component information detection part 18, while controlling not only operations related to determination and judgment and switching of spare components to be detailed later, but also controlling an entire mounting operation.

Figure 3:
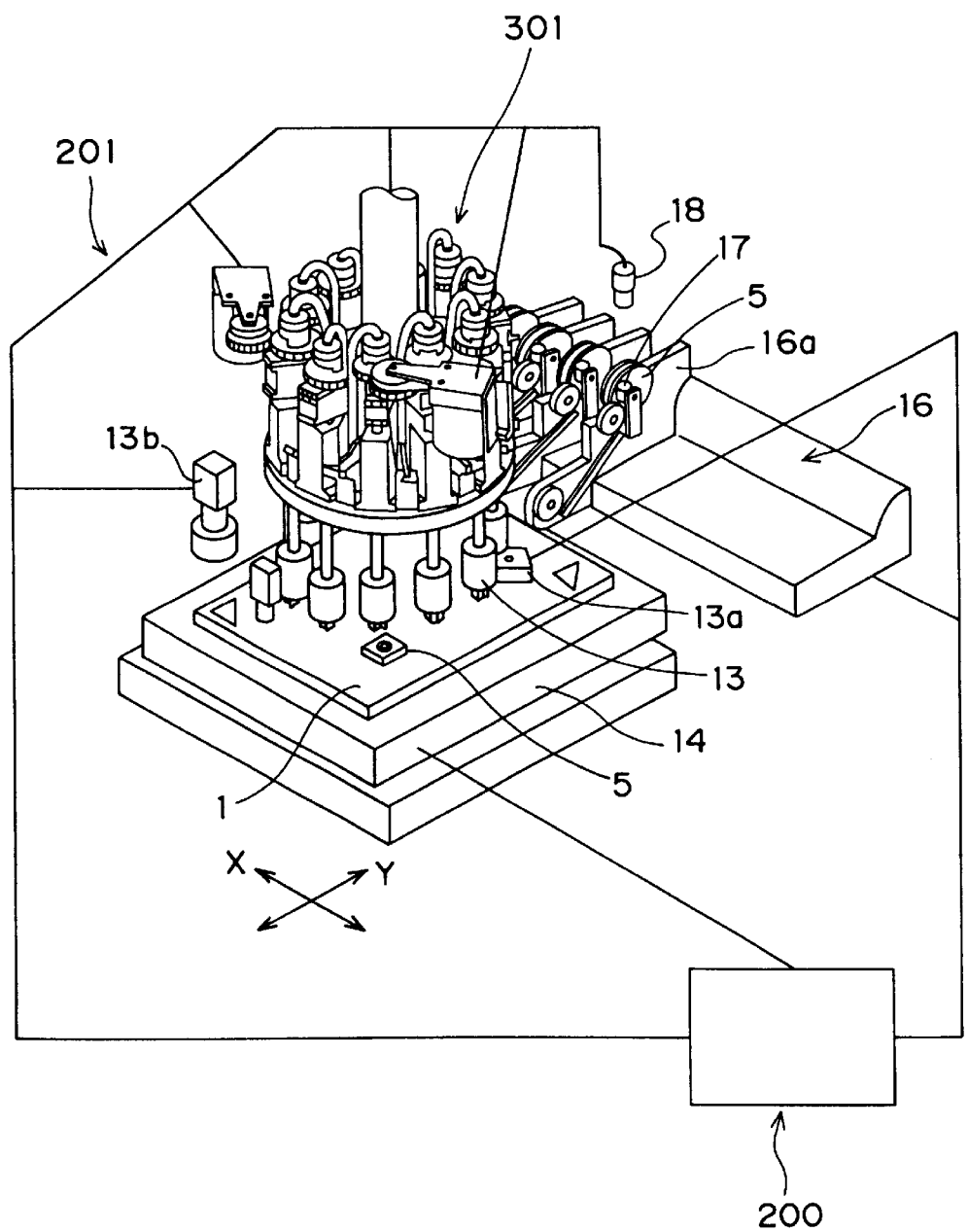
FIG. 3 is partial perspective view schematically showing the component mounting apparatus equipped with the component feed method and component mounting method according to the first embodiment of the present invention.
Figure 10:
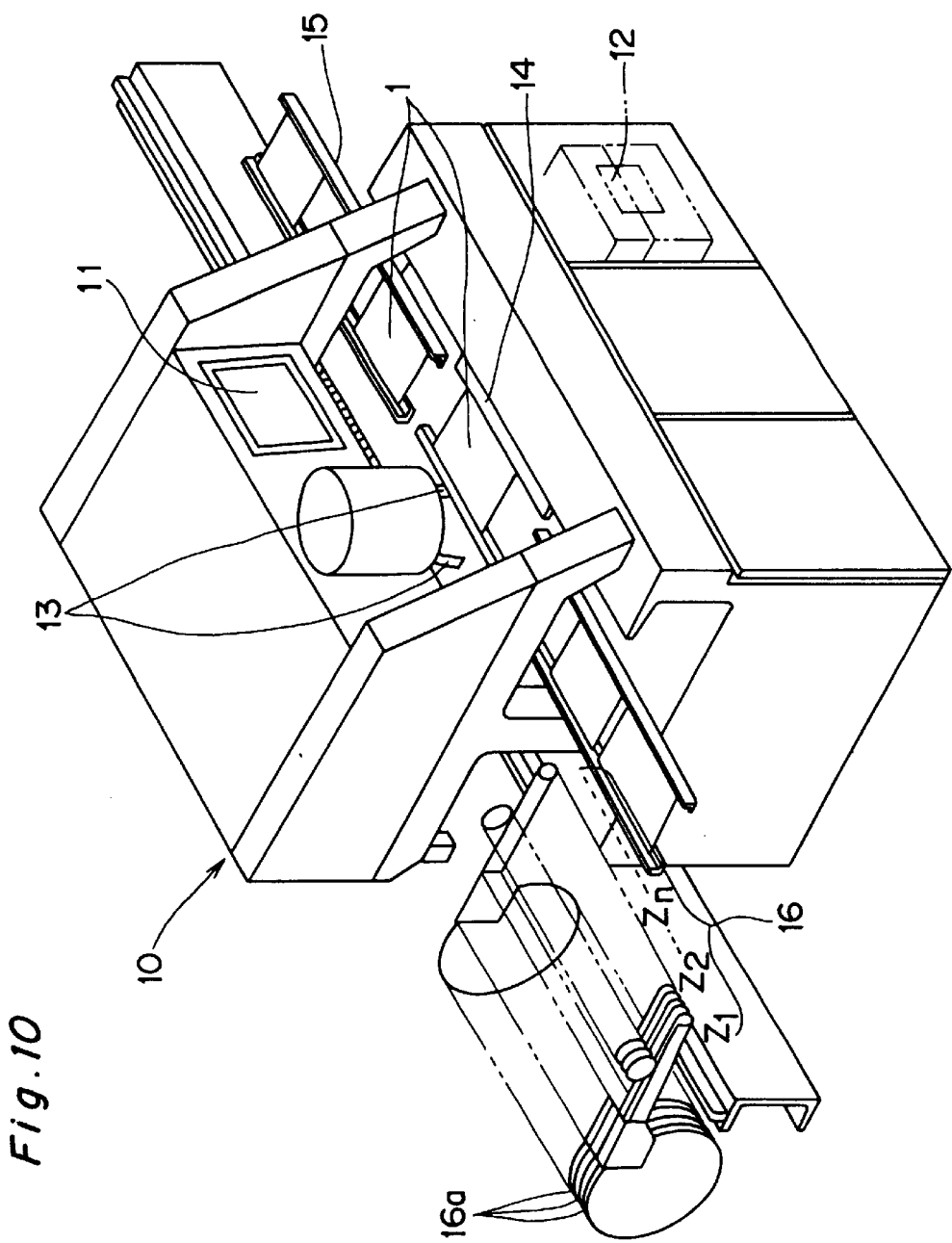
FIG. 10 is a partial perspective view of a conventional example of a high-speed type component mounting apparatus.

As shown in FIG. 3, in the constitution of the component mounting apparatus 201 of the first embodiment, the mounting control part 200 replaces the control part 12 in the component mounting apparatus 10 of a high-speed type as shown in FIG. 10.

In the component mounting apparatus 201 according to the first embodiment, electronic components 5 are mounted to printed boards 1 on the basis of the mounting program 20a under control of the mounting control part 200. Then, parts cassettes 16a of the component feed part 16 hold therein components 5 to be mounted for each type, or for each characteristic, to fit the mounting program 20a or component arrangement data of component data 20b. The parts cassettes 16a are arranged side by side at the component feed part 16. A necessary component 5 is supplied each time, on the basis of the mounting program 20a, from a predetermined one of the parts cassettes 16a to the mounting head 13. The mounting head 13 in turn holds the supplied component and mounts the component at a predetermined mounting position on printed board 1.

Operation of the component mounting apparatus 201 of the above constitution will be described on the basis of the flow chart of FIG. 1.

At a start of production of printed boards 1 by component mounting apparatus 201, under control of CPU 202, respective control parts 21–26 of the mounting control part 200 of FIG. 2 of the component mounting apparatus 201 and mechanical driving parts of the component mounting apparatus 201 are initialized at a mounting start process step (S1) in FIG. 1. In the meantime, a printed board 10 is set to mounting table 14.

Next, at a component take-out and feed process step (S2) in FIG. 1, the CPU 202 reads out component arrangement information in the mounting program 20a and in component arrangement data of component data 20b of the memory part 20, for example, Z1=P1, Z2=P2, Z3=P3, . . . Zm=Pm for A-type boards 1 and Z1=P3, Z2=PX, Z3=P1, Z4=PY, . . . , Zm=Pm for B-type boards 1, as shown in FIG. 5B, wherein P1–Pm are types of components 5 and Z1–Zm are arrangement positions of the parts cassettes 16a at the component feed part 16; that is, arrangement positions of components 5 of respective types.

Next, under control of the CPU 202, component feed control part 22, with judgement of presence/absence of an occurrence of component lack in a component lack detection process step (S3) of FIG. 1, removes a component 5 from the component feed part 16. In other words, in accordance with mounting information of the mounting program 20a, the component feed control part 22 obtains information on types, arrangement positions, and the like, of the components 5 to be mounted to the board 1 by the mounting head 13, and judges whether or not each of the components 5 to be mounted is stored in the parts cassette 16a set at a designated component arrangement position in the component feed part 16. If a component 5 to be mounted is present and stored in a designated parts cassette 16a, the process proceeds to a next process.

During a positioning and mounting process step (S4) in FIG. 1, the parts cassette 16a, which is designated at step (S3) and is judged not to lack a component, is slid to a component feed position of the mounting head 13, where the desired component 5 is sucked and held by the mounting head 13. While this component 5 is suitably controlled by positioning control part 24 and other control parts (for instance, controlled by the positioning control part 24 to be moved to a mounting position while being prevented by a height control part from colliding with other components, and being corrected in position and attitude so as to be mounted at a mounting position), the component 5 is accurately positioned by the mounting head 13 under control of the CPU 202 to the mounting position designated by the mounting program 20a, and mounted to the printed board 1 on the mounting table 14 as designated by the mounting program 20a.

During step (S5) of FIG. 1, the CPU 202 judges, based on the mounting program 20a, whether or not another component 5 to be mounted to the same board 1 remains. The CPU 202 repeats procedures from step (S2) to step (S4) until one sheet of the printed board 1 is completely finished. When a mounting operation is completed, a mounting end process is performed at step (S6) of FIG. 1. A finished board 1 is removed from the mounting table 14 while the CPU 202 performs board removal control.

During the component lack detection process step (S3) in FIG. 1, if the component feed control part 22 judges that a component of the same type as the component 5 to be mounted is absent from component data 20b, or in other words, as shown in FIGS. 5A–5C, if, for example, a P1-type component arranged at component arrangement position Z1 on a left end of the component feed part 16, is absent, spare component detection judgment process (S10) and spare component switch process (S11), which characterize the component mounting method of the first embodiment (named "a free alternate" operation), are adopted, which will be detailed hereinbelow. Specifically, in the free alternate operation, there is a known device, as a component detecting device, for reading by a reading device a memory feature, such as a bar code or the like, installed in the component feed part, for storing types of components, as is disclosed in Japanese Unexamined Patent Publication No. 4-164398, during the spare component detection judgment process (S10) of FIG. 1, thereby obtaining stored information to detect components. Referring to FIG. 3, for instance, component information detection part 18, which reads or writes component information from or to a component information memory 17, such as IC or the like arranged in the parts cassette 16a as one example in the prior art, is adapted to set as a spare component feed area 16s, component arrangement positions Zn, Zn+1, Zn+2, Zend, other than the component arrangement positions Z1–Zm of a component feed area 16n generally used at the component feed part 16, in component arrangement data of the mounting program 20a and component data 20b. Component type information PX, P1, P1, . . . , PY at component arrangement positions of the spare component feed area 16s are sequentially read out, whether or not the P1-type spare component for the component P1 to be mounted next is present is judged, and the parts cassette 16a storing the P1-type spare component is detected within the spare component feed area 16s of the component feed part 16. In a case where the spare component of the type is not detected, production is stopped at once at the component mounting apparatus 201 under control of the CPU 202 until an operator of the apparatus 201 supplements the P1-type components to the component feed part 16. On the other hand, when the P1-type spare component for the component P1 to be mounted next is detected at arrangement position Zn+1 of the spare component feed area 16s, during the spare component switch process (S11) of FIG. 11 the CPU 202 temporarily stores in the memory part 20 the P1-type spare component, at the spare component arrangement position Zn+1 in the spare component feed area 16s, as spare component information 20c, in place of the P1-type component at arrangement position Z1. Thereafter, component arrangement positions of component arrangement data of the mounting program 20a and the component data 20b are switched to a spare component arrangement position in the spare component feed area 16s for a lacking P1-type component, so that production is continued under a switched condition. Later again, if P1-type spare components at component arrangement position Zn+1 are depleted, the same procedures at (S10) and (S11) are executed, whereby a P1-type spare component at component arrangement position Zn+2 is used to continue production.

Supposing that the memory part 20 of the component mounting apparatus 201 contains the mounting program 20a for two types, A and B types, of boards 1 as indicated in FIG. 5B, after B type boards 1 are started to be subjected to mounting, subsequent to a type switch from the A type to B type, even when P1-type components at component arrangement position Z3 for a B type board 1 are depleted, a P1-type spare component at component arrangement position Zn+1 is detected in the same manner as in (S10) and (S11), and is used in place of a P1-type component at the component arrangement position Z3 of the B type board 1. Accordingly, continuous production is ensured irrespective of types of boards to be produced.

Referring to FIG. 5C, during supply of a P1-type component 5 by the parts cassette 16a, at component arrangement position Zn+1 of the component feed part 16, to the mounting head 13, even if the component information detection part 18 detects that a spare component at arrangement position Zn+1 changes to be type PZ halfway through the supply due to, for example, an operator's mishandling of components or setting of a wrong spare component for a C type board to be produced next, component arrangement position Zn+2 can be detected and judged correctly through procedures similar to (S10) and (S11) as a spare component at component arrangement position Z3 for a P1-type component. Wherever spare components are arranged, therefore, arrangement positions can be surely searched via a spare component detection judgment process and a spare component switch process, thus allowing free positional arrangement of spare components as well as easy exchange of spare components. Moreover, errors in setting components can be prevented, and preparation for subsequent production is prevented from adversely influencing current production. Quality in setting, and the like is improved.

According to the first embodiment described hereinabove, spare components can be automatically detected from the component feed part 16 where the parts cassettes 16a and parts trays 16d, which contain components, are set optionally. Therefore, need for setting components at component arrangement positions of the component feed part truly as designated is eliminated, and also need for forming a mounting program designating spare component information for every type of board to meet production of many types, i.e., various types of boards, is eliminated. Trouble of switching types of boards to be produced, or management work, and the like can be reduced. More specifically, even during an occurrence of component lack in the component mounting apparatus 201, whether or not spare components are present in the component feed part 16 is automatically detected without interrupting production, and the spare components detected are used to continue production, thereby improving productivity. Components set at the component feed part 16 are used as spare components only when components, which types are detected, are judged to agree with a type to be mounted. Generation of failures resulting from wrong supplement, or wrong setting of components, is effectively prevented, and product quality is improved.

The spare component feed area 16s may not be fixed in position in the component feed part 16, but the component feed part 16 in its entirety may be allotted as the spare component feed area 16s. Or, the component feed part 16 is divided to a plurality of blocks, and one block thereof including a specified number of arrangement units, or some blocks, are assigned as the spare component feed area 16s; or, component arrangement positions Zn–Zend, which are part of component arrangement positions Z1–Zend of the component feed part 16, can be designated as the spare component feed area 16s. Since the spare component feed area 16s can be freely set in the component feed part 16, more preferable and more flexible free alternate operation is realized.

Spare component information 20c is not limited to data stored that is different from component arrangement data of the mounting program 20a or component data 20b, and can be information included in the mounting program 20a or component arrangement data of component data 20b.

Second Embodiment

A component feed method, a component feeding apparatus, a component mounting method, and a component mounting apparatus according to a second embodiment of the present invention will be described with reference to FIG. 4.

Figure 11:
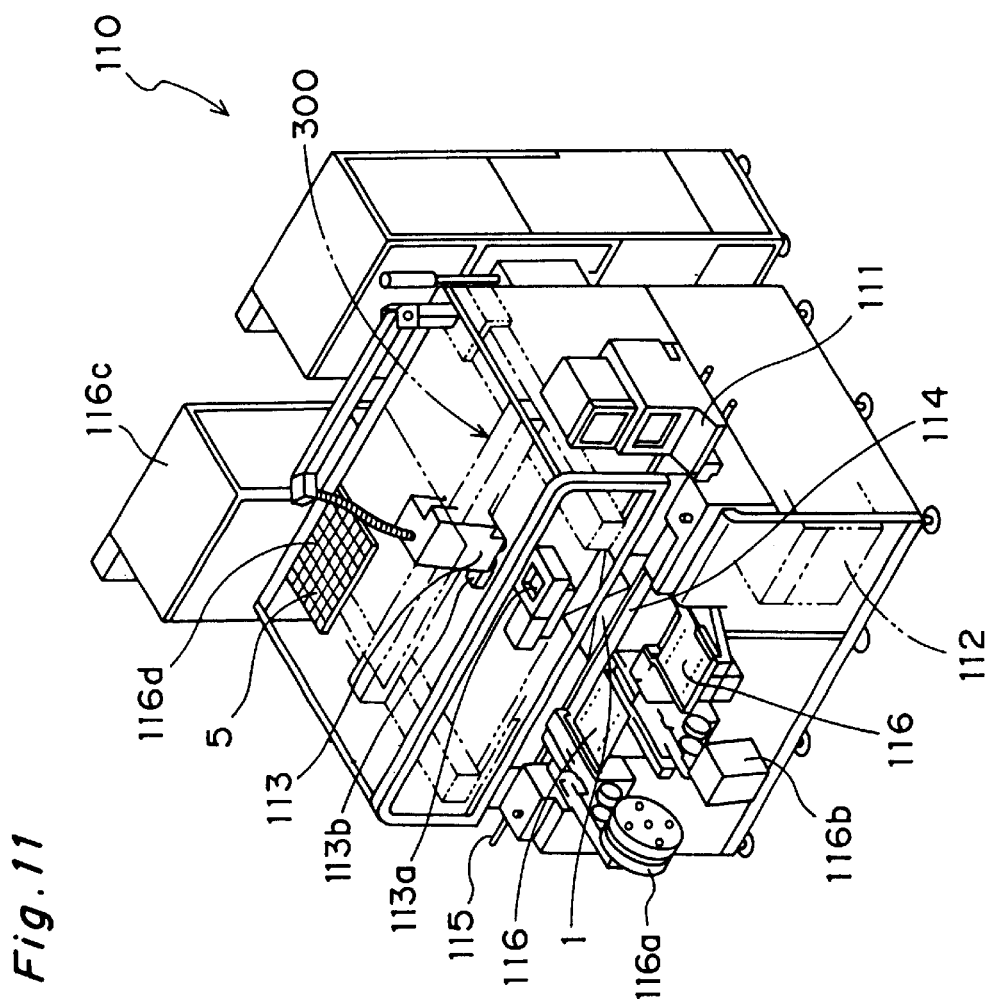
FIG. 11 is a partial perspective view of a conventional different example of a multi-functional middle-speed type component mounting apparatus.

A component mounting apparatus 211 equipped with a component feeding apparatus so that a component mounting method, including a component feed method (free alternate operation), can be carried out will be discussed as the second embodiment of the present invention. As shown in FIG. 4, the component mounting apparatus 211 is schematically constituted of a conventional component mounting apparatus 110 of a multi-functional middle-speed type as shown in FIG. 11, while having mounting control part 200 in FIG. 2 instead of control part 112. This mounting control part 200 is connected, as is clear from FIG. 4, to an XY robot, a mounting head 113, component feed part 116, a board recognition device 113a, a component inspection part 113b, a mounting table 114, and a component information detection part 118, thereby controlling not only operation at a time of spare component detection judgment and switching, but during an entire mounting operation. In the second embodiment, a spare component detection judgment process and a spare component switch process, almost similar to those of the first embodiment, are conducted. Operations and parts similar to the first embodiment or the conventional example are denoted by the same reference numerals as in the first embodiment or conventional example, and description thereof is omitted.

A difference of the second embodiment from the first embodiment is a manner of how to input component information. The component information detection part 1118 of the component mounting apparatus 211 is arranged at a side part of the board recognition part 113b fixed to a side part of the mounting head 113, which can be moved by the XY robot in an X direction and a Y direction orthogonal to the X direction. Component type information, and the like, stored in component information memories 117, such as ICs or the like, at parts cassettes 116a, a bulk cassette 116b, and parts trays 116d removed from a parts tray container part 116c of the component feed part 16, can be detected by the component information detection part 118. In contrast to the first embodiment, wherein component information in component data 20b or spare component information 20c stored beforehand in the memory part 20 is utilized to detect spare components within the component feed part 16, according to the second embodiment component information is not stored preliminarily, and the mounting head 113 is moved to determine component type information, and the like stored in the component information memory 117, such as an IC or the like, of the parts cassette 116a, bulk cassette 116b, parts tray 116d removed from the parts tray container part 116c of the component feed part 116, via the component information detection part 18 fixed to the mounting head 113. Determined information is then stored as component data 20b or spare component information 20c in the memory part 20 via input/output control part 21. Complicated work of manually storing component type information in the memory part 20 as component data 20b or spare component information 20c is eliminated. The second embodiment is an application of the first embodiment to a mounting apparatus of a multi-functional type adapted to receive components also from trays, and the like, while exerting the same effect and action as the first embodiment. Each of the parts cassette 116a, bulk cassette 116b, and parts tray 116d removed from the parts tray container part 116c of the component feed part 116, is provided with information memory according to the second embodiment, and therefore components can be mounted more correctly.

A two-dimensional bar code, or known QR code (quick response code of a matrix expressing numbers or characters in a machine readable form by a combination of cells (points) and spaces), may be applied as the component information memory 1117 to each component, e.g., QFP or CSP integrated circuit or a semiconductor component. The board recognition device 113a may be used as the component information detection part 118 to read information.

Third Embodiment

A component feed method, a component feeding apparatus, a component mounting method, and a component mounting apparatus according to a third embodiment of the present invention will be described with reference to the drawings.

In the third embodiment of the present invention, a spare component designation process ((S20) indicated by a chain line in FIG. 1) is additionally provided in component mounting apparatus 201, 211, which includes a component feeding apparatus so that a component mounting method including a component feed method (free alternate operation) can be executed.

Figure 6:
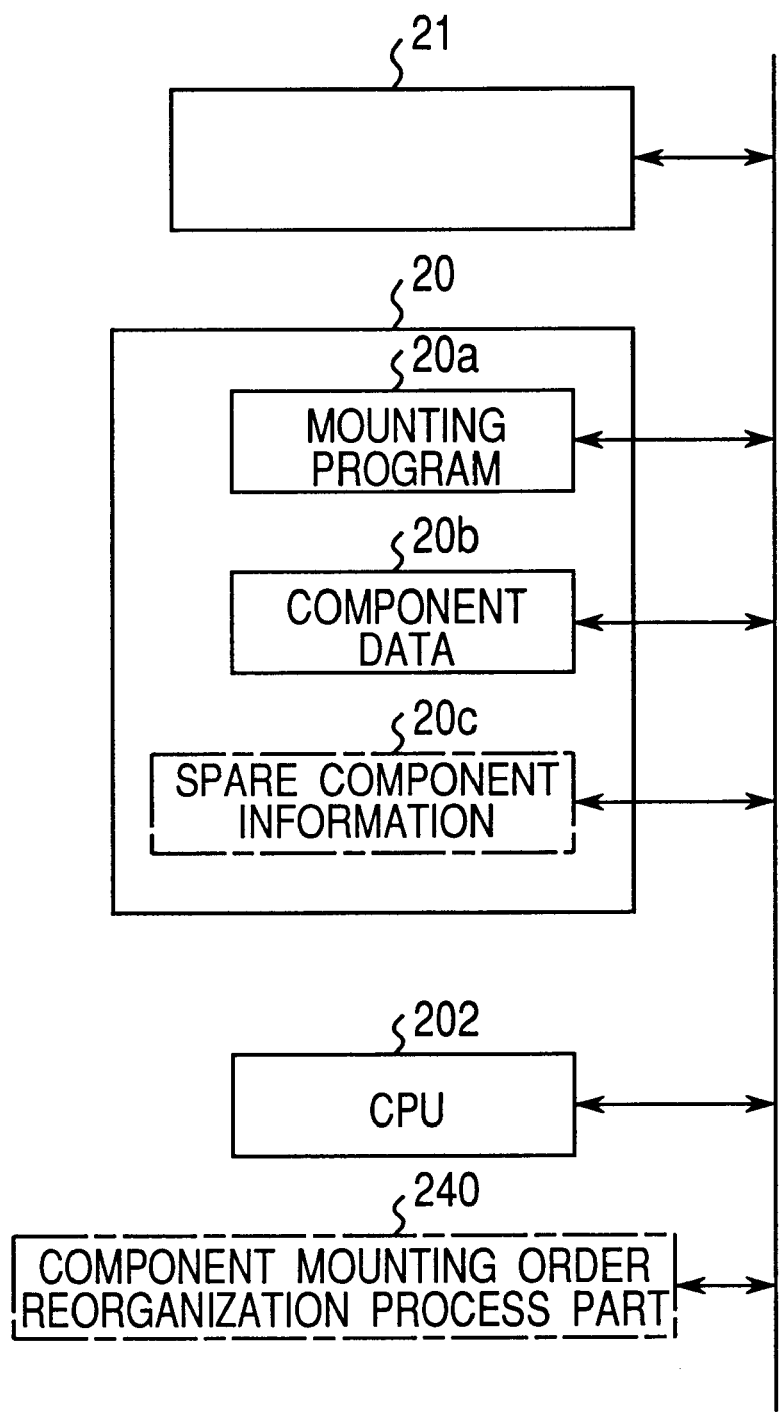
FIG. 6 is a schematic explanatory diagram indicating a part of a mounting control part for carrying out a spare component designation process during a component mounting feed method according to a third embodiment of the present invention.

FIG. 6 is a schematic diagram showing a constitution for the spare component designation process (S20) of the component feed method performed by the component feeding apparatus, which component feed method is performed during the component mounting method that is performed by the component mounting apparatus according to the third embodiment of the present invention.

In the component mounting method performed by the component mounting apparatus of the third embodiment, conditions such as various operation modes of free alternate operation, described later, regardless of whether the free alternate operation is performed, can be set under control of input/output control part 21 of mounting control part 200 via an operation part 11 or 111 having a keyboard and the like, of the component mounting apparatus 201 of FIG. 10 or the component mounting apparatus 211 of FIG. 11.

As a concrete example of conditions, how to handle spare component information, and whether the spare component information is to be detected and judged beforehand or at each time, are set as described below. Every time component lack occurs in the first and second embodiments, spare components are determined and determined information is stored as spare component information 20c in memory part 20, based on which a spare component detection judgment process ((S10) in FIG. 1), of judging whether components can be used as spare components, is executed. On the other hand, in the spare component designation process (S20) in the third embodiment, prior to a mounting start process (S1) of FIG. 1, component arrangement states of all spare components at component feed part 16 are read by component feed control part 22, which is an example of a spare component detection device. The read information is registered beforehand as spare component information 20d in the memory part 20. For instance, in the case of the component feed part 16 in FIG. 5A, such information is stored as spare component information 20d which informs that a P1-type component is found at component arrangement position Zn+1 when a P1-type component at component arrangement position Z1 is absent, and a P-type component is present at arrangement position Zn+2 when a P-type component is absent at component arrangement position Zn+1.

During execution of a spare component detection judgment process ((S10) of FIG. 1), at an occurrence of component lack, simply searching and judging data of spare component information 20d in the memory part 20 enables immediate determination of component arrangement positions of spare components. Accordingly, for every component lack, a detection judgment process of reading all information of component arrangement positions of spare component feed area 16s, of component feed part 16, from component data 20b by the component feed control part 22 to thereby detect and judge whether replaceable spare components are present or not, and an extra process, for example, of moving and positioning the component information detection part 18 to each parts cassette 16a, and reading information of component names from the parts cassettes 16a, can be eliminated together without a loss of time. Productivity can thus be further improved.

If information of subject spare components is adapted to be directly input as spare component information 20d, via a keyboard into memory part 20 under control of input/output control part 21 via operation part 11, 111 in the spare component designation process ((S20) represented by the chain line in FIG. 1), in the third embodiment of the present invention, and if data of a relationship between types and component arrangement positions of spare components is added to spare component information 20d in the memory part 20 beforehand, procedures are similarly carried out as according to the above embodiments, so that a free alternate operation is realized even if the component feed control part 22 in charge of spare component detection judgment process fails.

The spare component designation process of the third embodiment ((S20) indicated by the chain line in FIG. 1) thus enables information 20d of subject spare components to be directly input from the operation part 11, 111, to form spare component information 20d, even in the absence of component feed control part 22 as a spare component detection device of the conventional component mounting apparatus 10, 110 of FIGS. 10 and 11. A free alternate operation is thus achieved similarly.

According to the third embodiment, components to be used in common with various types of boards are registered beforehand as spare component information 20d. Therefore, when types of boards to be produced are switched, types of components to be mounted are determined from registered component types in the component feed part 16 and thus, presence/absence of spare components can be judged efficiently. It is not necessary to detect spare components from the component feed part 16 at each occurrence of component lack. Since spare components can be exchanged in a shortened process of equipment at occurrence of component lack, productivity can be improved further.

Fourth Embodiment

Figure 7:
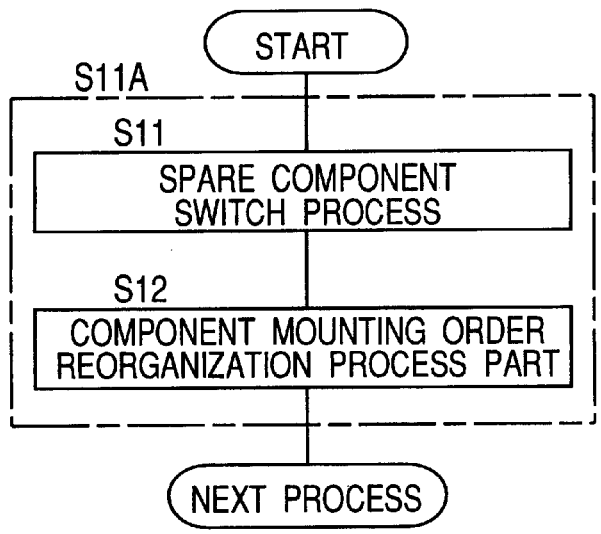
FIG. 7 is a schematic flow of processes of a fourth embodiment of the present invention.
Figure 8A:
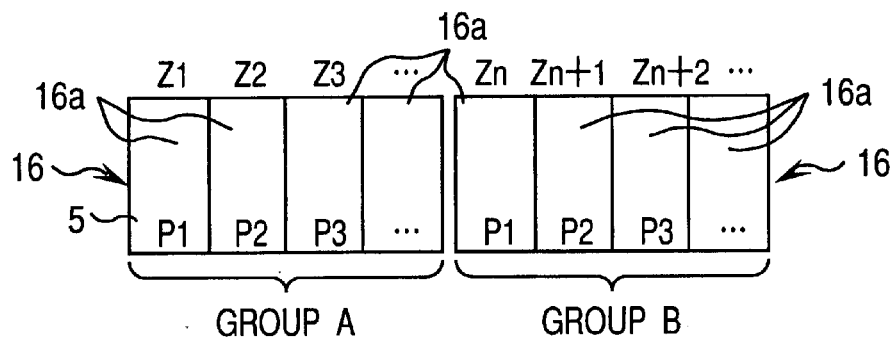
FIG. 8A is a diagram showing an example of a conventional exchange mode.
Figure 8B:
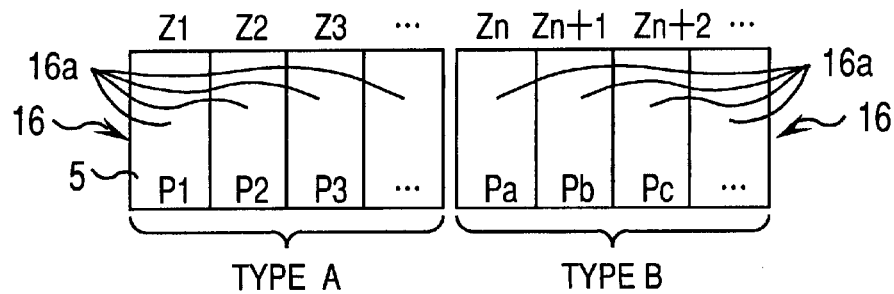
FIG. 8B is a diagram showing an example of a conventional preparation mode.
Figure 9A:
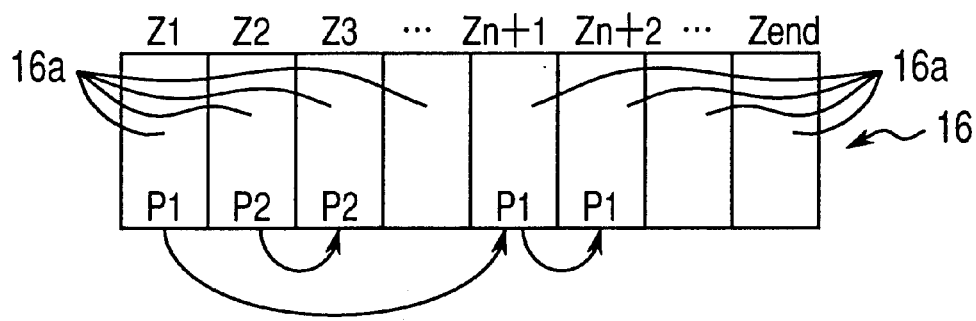
FIGS. 9A and 9B are schematic diagrams of examples of the conventional exchange mode during an alternate operation and a mounting program.
Figure 9B:
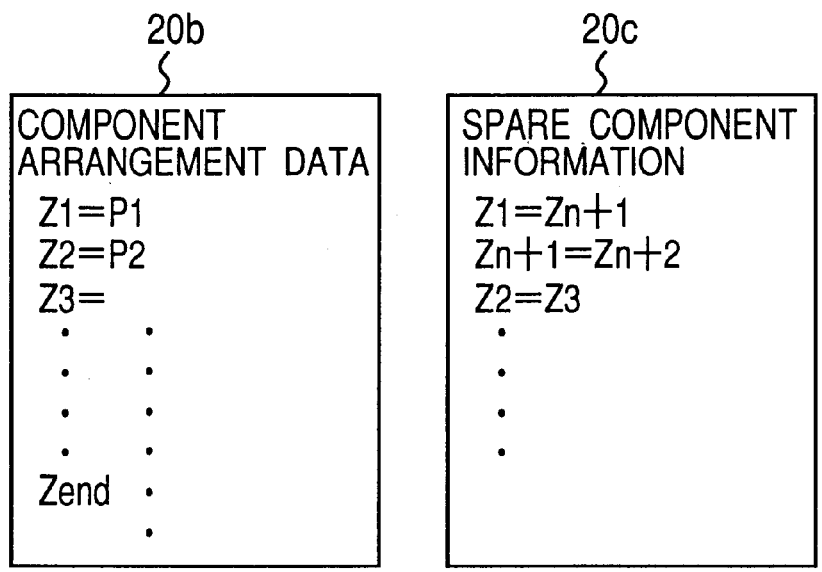

A component feed method, a component feeding apparatus, a component mounting method, and a component mounting apparatus according to a fourth embodiment of the present invention features a spare component switch process (S11A). As shown in FIG. 7, in a spare component switch process, a component mounting order reorganization process (S12) of FIG. 7 is performed at a component mounting order reorganization process part 240, indicated by a chain line in FIG. 6, after a spare component switch process (S11) of FIG. 1 is performed.

Generally in mounting components, components 5 are removed from component feed part 16 by mounting heads 13 and mounted to printed boards 1. In component mounting apparatus 201 in which the parts cassettes 16a of the component feed part 16 slide, as shown in FIGS. 3 and 10, in the case where it is necessary for a mounting head 13, after removing a spare component, to move a long distance via an XY robot to a removal position to remove a subsequent component, as indicated by mounting program 20a during execution of a free alternate operation, an operation if carried out according to a mounting order as indicated by an original mounting program before a component is switched to a spare component would produce waste. Production time per one board, that is, a mounting cycle time is greatly deteriorated thereby lowering productivity. As such, when a difference of movement distances of mounting head 13, before and after a spare component is switched during (S11), is not smaller than a predetermined threshold value, a component mounting order reorganization process ((S12) in FIG. 7) is performed by component mounting order reorganization process part 240 as shown by the chain line in FIG. 6. The component mounting order is reorganized and the mounting program 20a is rewritten so that mounting head 13 can move a shorter distance between a mounting position and a component feed position. Even when a component arrangement position is changed because of the spare component switch process ((S11) of FIG. 7), a suitable component mounting order, matching a feed state of the component feed part 16 is calculated not to decrease mounting cycle time and productivity and, then, the mounting program 20a is automatically regenerated. Production can be continued accordingly.

Fifth Embodiment

Figure 4:
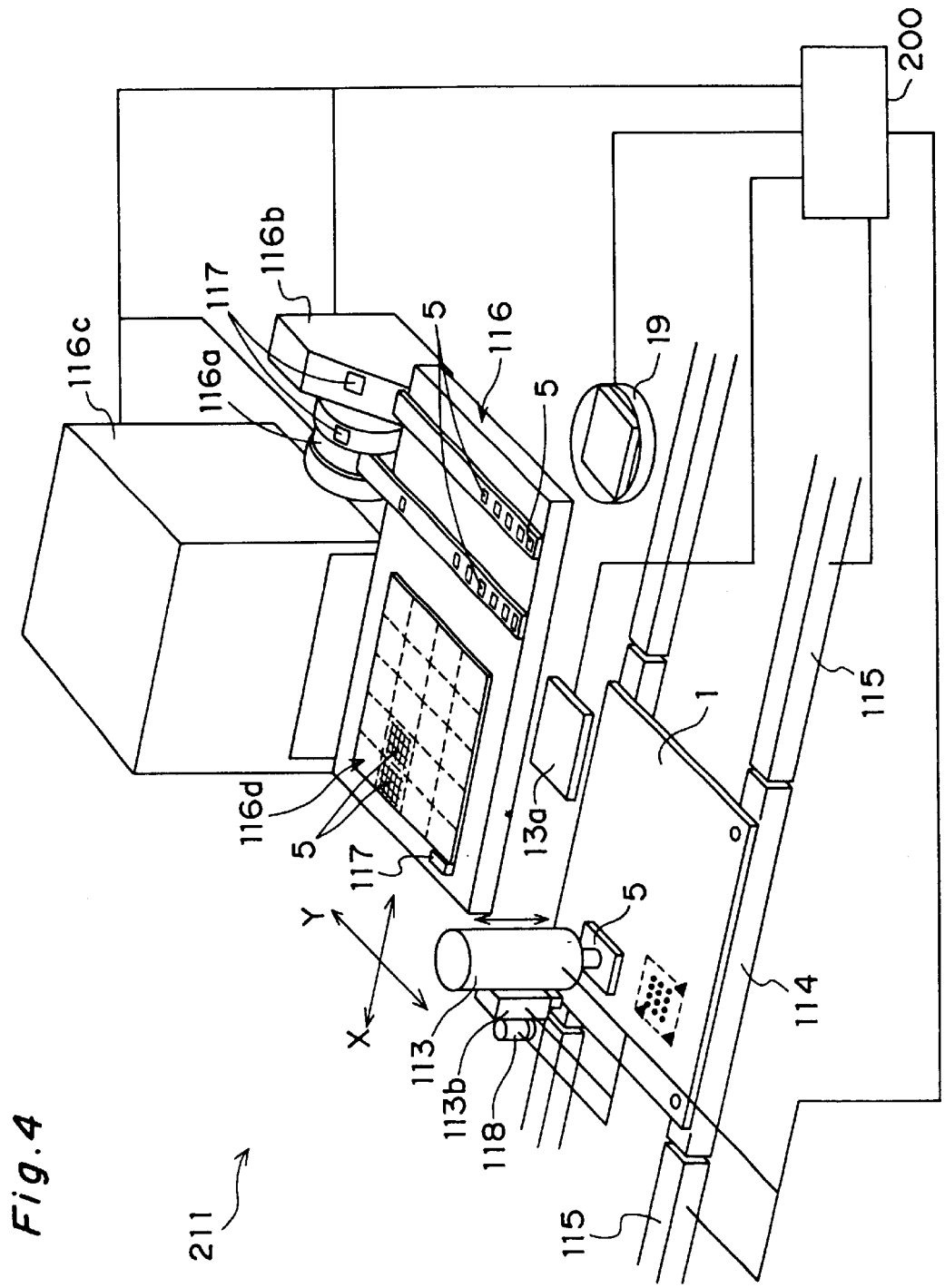
FIG. 4 is a partial perspective view schematically showing a component mounting apparatus equipped with a component feed method and a component mounting method according to a second embodiment of the present invention.

According to a component feed method, a component feeding apparatus, a component mounting method, and a component mounting apparatus according to a fifth embodiment of the present invention, component feed part 16, 116 in its entirety is treated as a spare component feed area 16s to produce optional types of boards 1 in the mounting apparatus 201 of FIG. 3 or mounting apparatus 211 of FIG. 4. At a production start process (step S1 of FIG. 1), component feed control part 22 detects information of component types, component arrangement positions, and the like of the entire component feed part 16, 116, so that component arrangement data of component data 20b of component feed control part 22, to be used by mounting program 20a, is automatically generated for production. In this case, it is enough to read only component arrangement data during a spare component detection judgment process. If a plurality of the same components are detected, these may be stored in spare component information.

With this constitution, components can be mounted correctly without an operator's awareness of a set position of parts cassettes 16a or 116a relative to the component feed part 16, 116 (referred to as "free layout production"). Furthermore, highly productive and high-quality production is enabled in association with a component mounting order reorganization process described in the fourth embodiment ((S12) of FIG. 7).

The present invention is not limited to the foregoing embodiments and can be embodied in various forms. For example, although the component detection device is constituted of component information memory 17 and component information detection part 18 in the above description of the embodiments, other kinds of sensors or any other device that can judge types of components, e.g., ID code or the like can be used.

Figure 12:
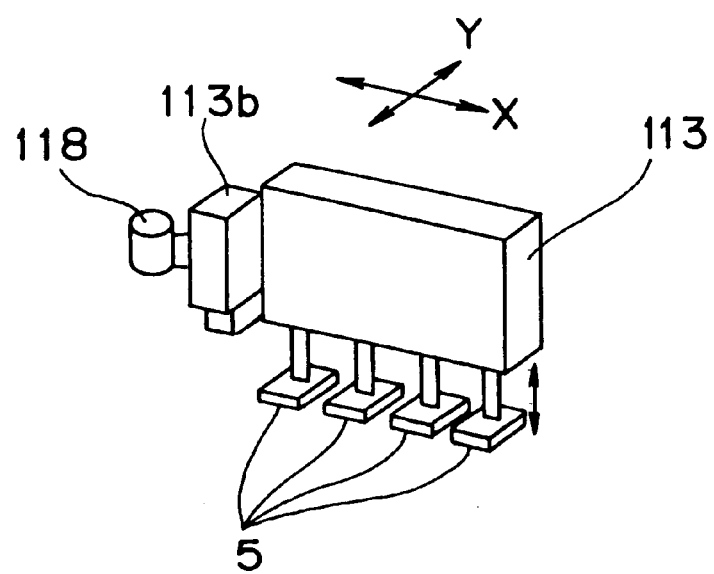
FIG. 12 is a partial perspective view schematically showing the component mounting apparatus equipped with the component feed method and component mounting method according to the second embodiment, which has a multi-nozzle type mounting head for holding a plurality of, four in the figure, components.

In the second embodiment, the mounting head 113 described holds one component 5. However, the mounting head 113 may be equipped with multi nozzles to hold a plurality of, e.g., four components as shown in FIG. 12, or two or more mounting heads 113 can be set in the mounting apparatus.

Component arrangement data of component data 20b is containable in mounting program 20a.

A spare component is not necessarily a substitute of the same type. A substitute of the same characteristic or even a substitute manufactured by a different maker and having a different characteristic (e.g., temperature characteristic), which matters little, is utilizable. In that case, whether the spare component is proper or not is judged on the basis of a component characteristic or the like, not the component type as above, and information of the component characteristic or the like is stored for this purpose. Also, information of both component type and component characteristic can be used to make the judgment.

According to the component feed method, component feeding apparatus, component mounting method, and component mounting apparatus in one embodiment of the present invention, as described above, spare components can be automatically determined from a component feed part where parts cassettes and parts trays, holding components, are set optionally. A need of setting components to component arrangement positions of a component feed part as designated is eliminated. Moreover, a need of forming a mounting program for designating spare component information for every type of various boards to be produced is eliminated. Preparation and management work for switching of production types is reduced. Concretely, spare components are detected within the component feed part, and whether spare components are set in the component feed part is automatically judged without interrupting production or productivity while decreasing a mounting cycle time even during an occurrence of component lack. With spare components detected to be present in the component feed part, the spare components are utilized to continue production, so that productivity is improved. In a case where types or characteristics of spare components set in the component feed part are determined, only when the spare components set in the component feed part are judged to fit a type or characteristic to be mounted, are the spare components used. Accordingly, failures resulting from wrong setting or wrong supplement of components can be avoided and product quality can be improved.

A spare component feed area in a component feed part may not be fixed in position. The component feed part in its entirety can be allotted as the spare component feed area, or the component feed part may be divided into a plurality of blocks, all of, one of or some of which are respectively employed as spare component feed areas. Also, a further idea is conceivable, whereby component arrangement positions as part of component arrangement positions in the component feed part may be designated as the spare component feed area. Since the spare component feed area can be freely set at the component feed part, more favorable and more flexible free alternate operation is realized.

In another embodiment of the present invention, components to be used in common among various types of boards are registered as spare component information beforehand. In switching the types of boards, a type or characteristic of components to be mounted is detected from a registered type or characteristic of components in a component feed part, thus enabling effective judgment with regard to presence/absence of spare components. Detection of spare components from the component feed part is not necessary for each occurrence of component lack. Switching can be handled in a shorter time in line to cope with component lack, and productivity can be further improved.

According to the present invention in another embodiment, after spare components are automatically switched during a spare component switch process due to an occurrence of component lack, a mounting order matching a switched feed state for the spare components is performed and the mounting program is regenerated during a component mounting order reorganization process. Thus, highly productive and high-quality production can be performed.

Moreover, in another embodiment of the present invention, because of automatically detecting spare components from a component feed part set optionally, a need of setting subject spare components to a component feed position of the component feed part as designated is eliminated. A mounting program for designating spare component information for each type of board is not required to be formed even when various types of boards are to be produced. Preparation, management work, and the like for switching can be reduced effectively.

A feed position of spare components of types or characteristics is determined from a component feed part, so that wrong production because of wrong setting of spare components can be prevented.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component feed method for supplying a component to be mounted onto a printed circuit board, comprising:

detecting an occurrence of a lack of a component at a designated component arrangement position of a component feed part, wherein the component and the designated component arrangement position are designated by a mounting program;

using a first reading device to read component information from a memory feature in the component feed part;

based on the component information read from the memory feature, determining whether a spare component is in a spare component feed area of the component feed part;

judging whether the spare component is located in the spare component feed area at a spare component arrangement position; and when the spare component is judged to be located at the spare component arrangement position within the spare component feed area, switching from supply of the component from the designated component arrangement position to supply of the spare component from the spare component arrangement position.

2. The component feed method according to claim 1, wherein judging whether the spare component is located within the spare component feed area comprises judging whether the spare component is located within a component feed area other than a component feed area designated by the mounting program.

3. The component feed method according to claim 1, wherein determining, based on the component information read from the memory feature in the component feed part, whether the spare component is in the spare component feed area of the component feed pair comprises determining, based on spare component information previously stored and read from the memory feature in the component feed part, whether the spare component is in the spare component feed area of the component feed part.

4. The component feed method according to claim 1, further comprising:

using the first or another reading device to read previously stored spare component information from a memory feature in the component feed part; and based on the spare component information read from the memory feature, determining a component arrangement state of the spare component when judged to be in the spare component feed area.

5. A component feed method for supplying a component to be mounted onto a printed circuit board, comprising:

detecting an occurrence of a lack of a component at a designated component arrangement position of a component feed part, wherein the component and the designated component arrangement position are designated by a mounting program;

determining whether a spare component is in a spare component feed area of the component feed part; and when the spare component is judged to be located in the spare component feed area, switching from supply of the component from the designated component arrangement position to supply of the spare component from the spare component feed area.

* * * * *

UNITED STATES PATENT AND TRADEMARK OFFICE
CERTIFICATE OF CORRECTION

PATENT NO. : 6,877,220 B1
DATED : April 12, 2005
INVENTOR(S) : Takeshi Kuribayashi et al.

It is certified that error appears in the above-identified patent and that said Letters Patent is hereby corrected as shown below:

Column 17,
Line 9, change "pair" to -- part --.
Line 11, insert -- in -- after "stored".

Signed and Sealed this

Sixth Day of September, 2005

JON W. DUDAS
*Director of the United States Patent and Trademark Office*